United States Patent
Katla et al.

(10) Patent No.: US 7,058,912 B2
(45) Date of Patent: Jun. 6, 2006

(54) NOTIFYING STATUS OF EXECUTION OF JOBS USED TO CHARACTERIZE CELLS IN AN INTEGRATED CIRCUIT

(75) Inventors: Sreekantha Madhava Katla, Bangalore (IN); Omkumar Seshadri, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 386 days.

(21) Appl. No.: 10/651,981

(22) Filed: Sep. 2, 2003

(65) Prior Publication Data
US 2005/0050480 A1    Mar. 3, 2005

(51) Int. Cl.
*G06F 17/50* (2006.01)
(52) U.S. Cl. ............. 716/7; 716/2; 716/6; 716/18
(58) Field of Classification Search ........... 716/1, 716/7, 18, 2, 6; 703/13, 14
See application file for complete search history.

(56) References Cited

U.S. PATENT DOCUMENTS 5,519,848 A * 5/1996 Wloka et al. ............. 703/13

\* cited by examiner

*Primary Examiner*—Thuan Do
(74) *Attorney, Agent, or Firm*—Alan K. Stewart; W. James Brady, III; Frederick J. Telecky, Jr.

(57) ABSTRACT

The status of execution of jobs (used to characterize cells) is notified asynchronously. As a result, the processing and network resources may be optimally used. In an embodiment, a flow controller divides an entire characterization task into multiple jobs, and schedules each job for execution on one of several client machines. The client machine sends a notification asynchronously after completion of execution of the job. In an embodiment, the asynchronous communication is implemented using socket interface on top of TCP/IP protocol.

22 Claims, 4 Drawing Sheets

101 : Setup spice deck

102 : Run spice instance 1

103 : Run spice instance 2

105 : Analyze waveforms

107 : Generate an output file

NOTIFYING STATUS OF EXECUTION OF JOBS USED TO CHARACTERIZE CELLS IN AN INTEGRATED CIRCUIT

BACKGROUND OF THE INVENTION

1. Field of the Invention

The present invention relates to computer aided design (CAD) of integrated circuits, and more specifically to a method and apparatus for notifying the status of execution of jobs used to characterize cells in an integrated circuit.

2. Related Art

Integrated circuits (ICs) generally contain several components (flip-flops, pins, logic gates, multiplexors, etc.) commonly referred to as cells. To facilitate designing of ICs using CAD tools (implemented on computer systems), it is often desirable to determine the behavior of each cell under various conditions (e.g., combination of different manufacturing process, temperature, voltage, etc.), and the corresponding task is generally referred to as characterization. Once all potential cells of interest are characterized, the corresponding results can be used to quickly design any desired IC.

Characterization of cells often requires a large number of computations, generally due to several combination of conditions and the number of parameters of interest, the potential variations in input signals, etc. For example, in characterizing a two input AND gate, four parameters (e.g., path delay, input pin capacitance, rise time of output signal), 20 combinations of conditions, and input signals with possibly 5 slews (the rate at which the input signal rises/falls), 5 loads on output pins may be of interest. As may be appreciated, the number of characterizations required in such a scenario equals at least several hundreds.

Assuming that 600 cells (OR gate, NAND gate, etc.) need to be characterized, the number of characterizations required equals many thousands. Each of such characterizations may in turn require many computations. Accordingly, depending on the processing power available, the characterizations together may consume a long period (e.g., many days). In general, it is desirable to decrease the time for characterizations.

In one approach, each characterization is divided into several jobs, and the jobs are executed in parallel using a number of computer systems (client machines). In general, a job refers to a portion of a characterization, which can be performed by executing corresponding software instructions as an independent program. The parallelism that can be exploited is often limited by data/signal dependencies among the jobs, the number of machines, number of jobs that can be executed on each machine, etc., as is well known in the relevant arts.

In general, the jobs are scheduled for execution based on completion of execution of prior (scheduled) jobs both due to the data/signal dependencies and the limited number of jobs that can be executed in parallel. Accordingly, it may be desirable for a scheduling task to have information on the status of execution (at least as to whether execution is complete) of various jobs already executing.

In one prior approach, a central machine polls (e.g., round robin fashion) each client machine at regular intervals to determine the status of execution of jobs executing on the corresponding machine. One disadvantage with the above approach is that polling based approaches result in processing overhead in both the machine from which polling is being performed and the client machine, and also traffic overhead if a network is used between the two machines.

In addition, a client machine may remain idle corresponding to a time duration between completion of execution of a job(s) and a subsequent poll. The idle time can be decreased by decreasing the polling interval, but unfortunately smaller polling intervals generally lead to a corresponding increase in the processing and traffic overheads noted above. Accordingly such an approach may be undesirable at least in some environments.

In another prior approach, the status of execution of jobs is written into a file stored on a secondary (or persistent) storage. An individual file may be maintained in each client system or shared by several client systems. The status of execution of various jobs can be determined by examining the file(s). Such an approach may also have at least some of the disadvantages (processing and traffic) noted above with respect to polling.

There may be additional overhead associated with sharing (i.e., potentially multiple client systems attempting to write to the same file, and another system trying to read from the files) of the files. For example, a file may need to be locked while data is being written, and released once the writing is complete. Client machines may remain idle while waiting to access a locked file resulting in under utilization of resources present in client machines. Accordingly, such solutions may also not be desirable in several environments.

What is therefore needed is an improved method and apparatus for notifying the status of execution of jobs used to characterize cells in an integrated circuit.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

Figures 1A, 1B:
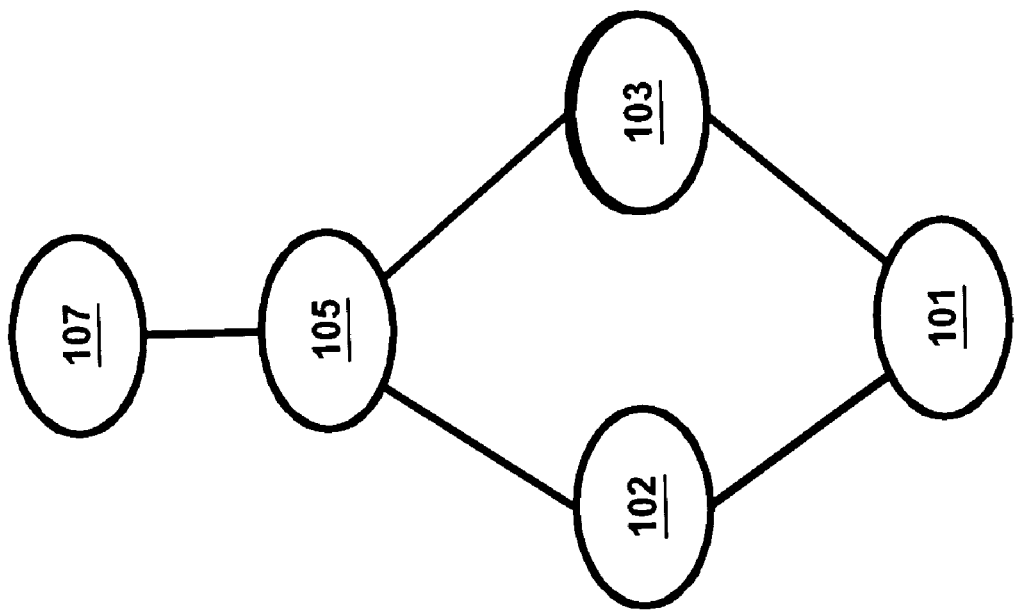
FIG. 1A depicts a set of statements representing multiple jobs to be performed while determining a delay between an input terminal and an output terminal of a cell in an integrated circuit.
FIG. 1B is a graph illustrating the details of dependencies corresponding to the jobs of FIG. 1A.

An aspect of the present invention enables client machines to asynchronously notify the status of execution of jobs used to characterize cells used in the design of an integrated circuit. For example, if the execution of a job is complete, the client system may immediately send a message indicating that execution of the job is complete. A central machine (used, for example, to schedule jobs) may receive the message, and perform any additional tasks using the information in the message.

As polling-type approaches need not be applied, the processing and traffic overhead (noted in the Background Section above) may be avoided. In addition, as information on status is timely available to the central machine, subsequent jobs may also be quickly scheduled, thereby avoiding idle time on the client machines.

In one embodiment using the above approach, a flow controller (implemented in a central machine) divides a characterization task into several jobs along with associated dependencies, and sends data to a job manager indicating the specific jobs that are ready for execution. The job manager determines a suitable client machine to execute each job based on various factors such as the present load on the client machine, the processing power of the client machine, etc.

The job manager then assigns the job to the client machine. To implement asynchronous notification, the software program forming the job, is executed by a wrapper program. The wrapper program may execute the job as a separate process/thread, and monitor the status of execution of the job. When the process/thread completes execution and terminates, the wrapper program immediately sends a message indicating completion of execution of the job.

The flow controller may accordingly be implemented to receive the message and indicate to the job manager that additional jobs are ready for execution. In general, flow controller and the wrapper program need to be implemented according to cooperating protocols. In one implementation, the messages are sent/received using sockets implemented on TCP/IP, well known in the relevant arts. The wrapper program is implemented in PERL language also well known in the relevant arts.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Characterization Problem

In general, each characterization task is logically divided into several jobs, while identifying the dependencies which force an execution order among the jobs. In the description below, dependencies and execution order are shown in the form a graph (with the jobs that can be executed first shown as leaves, and the jobs that need to be executed only later shown higher in the graph). An example characterization problem is described below with reference to FIGS. 1A and 1B.

FIG. 1A depicts a set of statements representing multiple jobs to be performed to characterize an example cell of a cell library, and FIG. 1B the corresponding graph. The set of statements represents a flow used to measure the signal delay between the input terminal and the output terminal. However, it will be readily appreciated that the statements are generally applicable to measure several other types of parameters (e.g., capacitance) as well.

Each statement represents a job, and the jobs together generate an output file containing measured value of a delay. Various aspects of the present invention are described with reference to FIGS. 1A and 1B merely for illustration. The invention can be used in characterization of other cells and using other types of representations as well. Each statement of FIG. 1A is described below in further detail.

Job 101 of FIG. 1A is entitled, 'setup spice deck', which performs various initializations necessary for simulating the specific cell. In general, the initializations depends on the specific tools used. In an embodiment, jobs 101, 102 and 103 are performed on a Unix work station implementing Spice simulation tools, widely available in the market place. As this is the first job which can be executed first, job 101 is shown as a leaf at the bottom of the graph.

Jobs 102 and 103 of FIG. 1A are respectively entitled, 'run spice instance 1' and 'run spice instance 2', indicating that simulation is performed for two different PTV (manufacturing process, temperature and voltage) combinations to determine the corresponding delay. As jobs 102 and 103 can be performed only after job 101, jobs 102 and 103 are shown as intermediate nodes after job 101 in FIG. 1B.

Job 105 of FIG. 1A is entitled, 'analyze waveforms' which indicates that the outputs (e.g., waveforms) of the simulation instances (jobs 102 and 103) are examined to determine the delay. The two waveforms (result of execution of jobs 102 and 103) may be examined in a known way to determine the desired delay.

As job 105 can be performed only after completion of jobs 102 and 103, the corresponding dependency is depicted by job 105 being at a higher level than jobs 102 and 103. Job 107 of FIG. 1A is entitled, 'generate output file' ('J5'), which examines the output of job 105, and writes the data in a form suitable for processing by subsequent jobs.

From the above, it may be appreciated that at least to schedule the dependent jobs (e.g, 102 and 103 are dependent on ob 101, job 105 is dependent on jobs 102 and 103), it is desirable to communicate the status of execution of various jobs. The manner in which such status can be communicated is described below in further detail with reference to various examples.

3. Method

Figure 2:
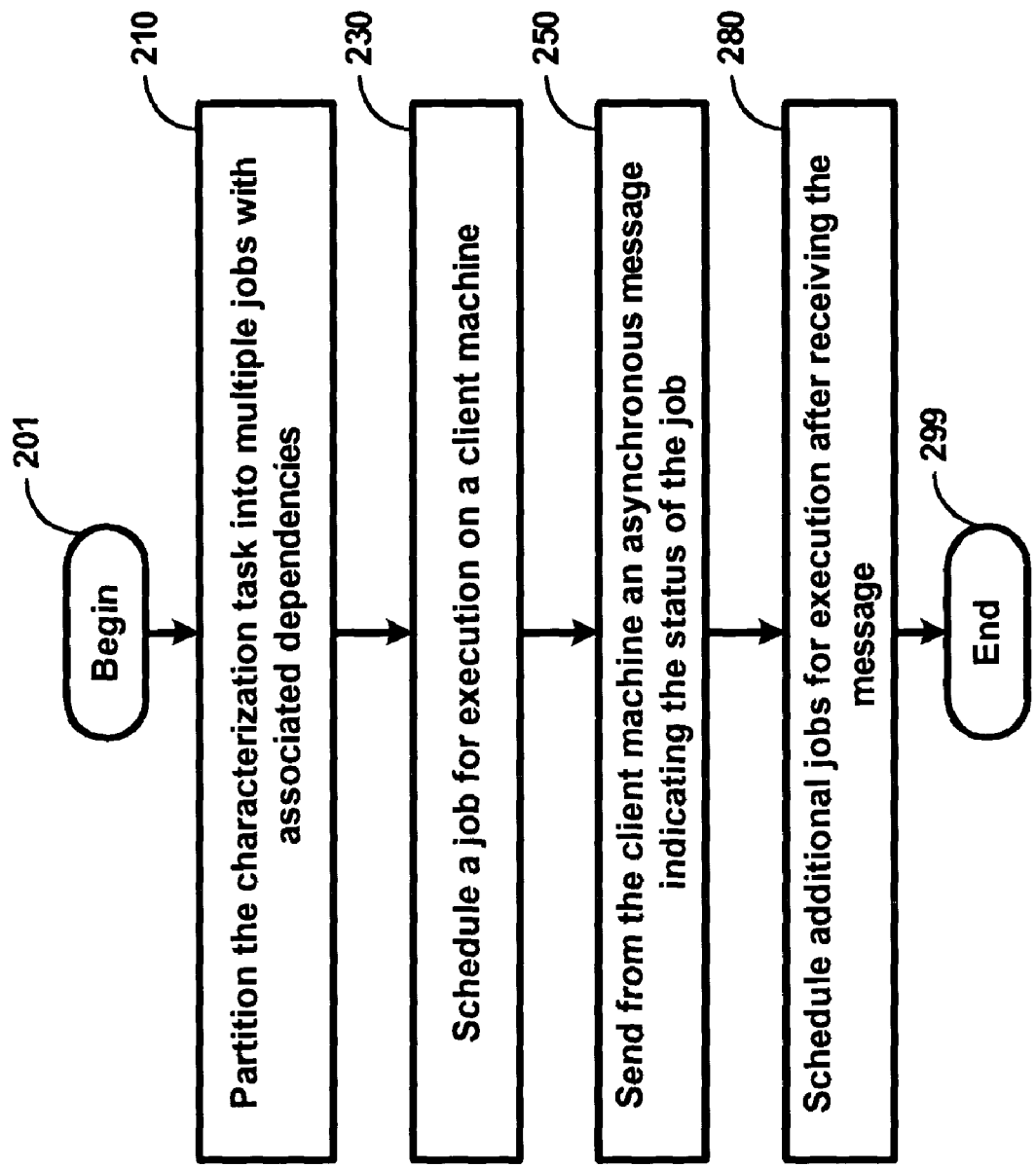
FIG. 2 is a flow-chart illustrating the details of a method using which the status of execution of jobs may be notified according to an aspect of present invention.

FIG. 2 is a flow-chart illustrating the details of a method using which a notification of the status of execution of jobs may be provided according to an aspect of present invention. The method is described with reference to FIGS. 1A and 1B merely for illustration. However, the method may be implemented to receive messages while executing other jobs as well. The method begins in step 201, in which control immediately passes to step 210.

In step 210, a central machine partitions characterization task into multiple jobs with associated dependencies. For illustration, a task of determining a delay is partitioned into five jobs 101–107 with associated dependencies as described above.

In step 230, the central machine schedules a job for execution on a client machine. In general a job scheduled consistent with the dependencies based on availability of resources for execution.

In step 250, the client machine sends an asynchronous message indicating the status of the job. In an embodiment, the status message is sent only upon completion of execution of the job at the client machine. Alternatively, messages reflecting the present status of execution (e.g., amount of processing time consumed) of the job may also be sent.

In step 280, the central machine may receive the message and schedule any dependent jobs for execution (assuming that the status message indicates completion of execution of the job scheduled in step 230). The method ends in step 299. Steps 250 and 280 may be repeated until all the jobs are scheduled for execution.

Thus, jobs may be scheduled for execution based on asynchronous messages (indicating the status of assigned jobs) received from client machines executing the jobs. As the messages are sent in an asynchronous manner, processing/network traffic overheads may be avoided. The description is continued with respect to an example environment in which several aspects of the present invention can be implemented.

4. Example Environment

Figure 3:
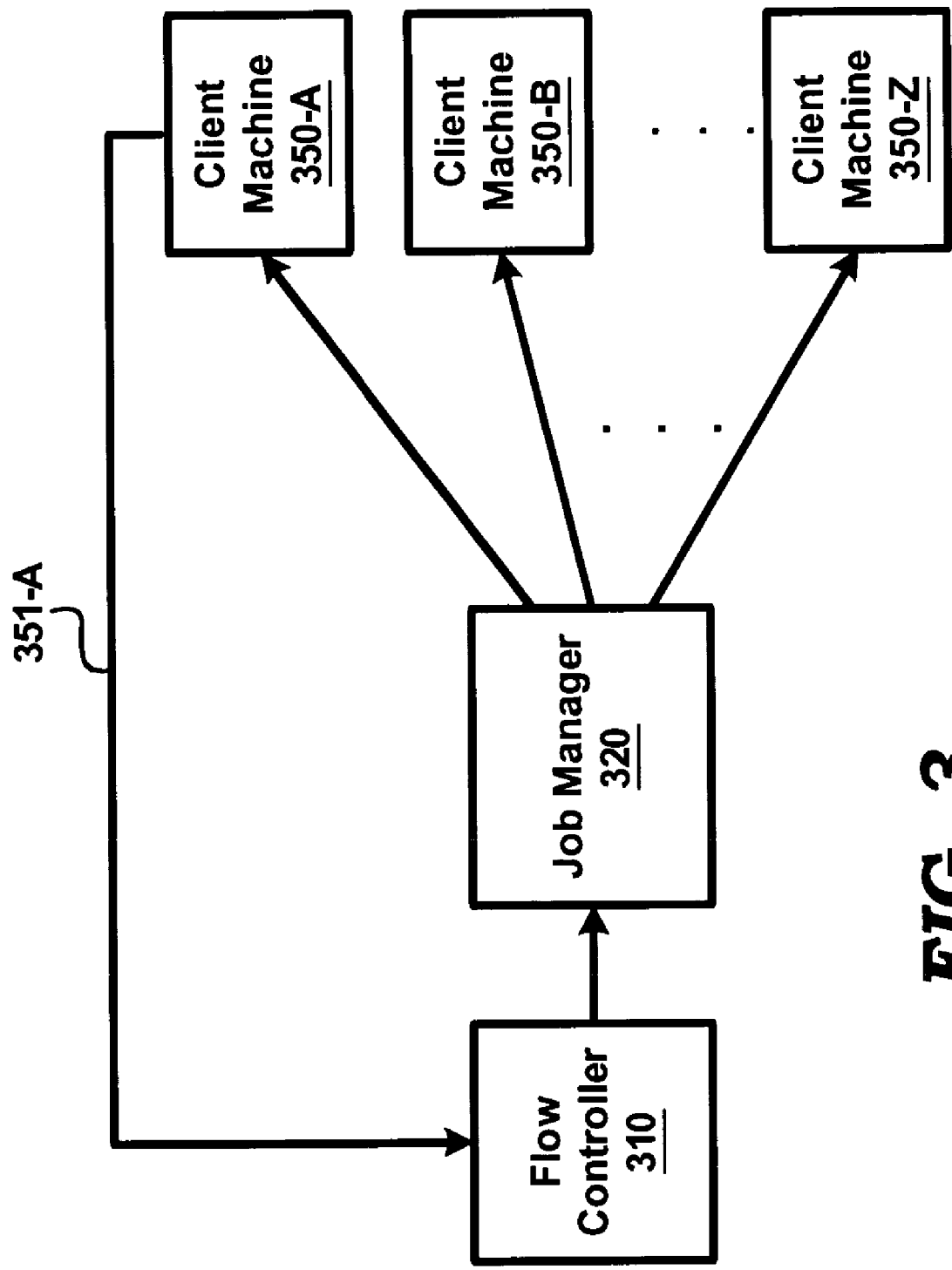
FIG. 3 is a block diagram illustrating an example environment in which several aspects of the present invention may be implemented.

FIG. 3 is a block diagram illustrating the details of an example environment for implementing various aspects of present invention. The example environment is shown containing flow controller 310, job manager 320, and client machines 350-A through 350-Z. Each system is described below in detail.

Job manager 320 assigns to one of the client systems each job indicated to be ready for execution. Jobs may be allocated based on availability of resources on each of client machines 350-A through 350-Z. For example, job 101 may be assigned to client machine 350-A, and jobs 102 and 103 may be respectively assigned to client machines 350-A and 350-B simultaneously after execution of job 101 is completed by client machine 350-A.

The availability of resources can be determined using various tools (e.g., execution of remote shell command to determine load in the past few minutes, network management tools, etc.). An embodiment of job manager 320 is implemented using LSF (Load Sharing Facility) Product, available from Platform Computing Inc., 3760 14th Avenue, Markham, Ontario L3R 3T7, Canada, Phone: (905) 948-8448.

Each of client machines 350-A through 350-Z executes the job assigned by job manager 320. In addition, each client machines sends an asynchronous message indicating the status of execution. Such a feature can be implemented using one of several approaches. An example approach is described below in further detail.

Flow controller 310 partitions a characterization task (of characterizing cells in an integrated circuit) into multiple jobs, and indicates to job manager 320 the specific jobs that are ready for execution (i.e., all jobs in the path from the leaf node are executed). In addition, flow controller 310 receives asynchronous messages indicating the status of execution of each job.

In an embodiment, flow controller 310 causes each client machine to execute a wrapper program, which in turn executes a corresponding job(s). The wrapper program reports the status of execution of the job. The details of such an embodiment are described below in further details.

5. Wrapper Program

In an embodiment, each client machine is implemented using a Unix-type system which supports Perl Programming Language, well known in the relevant arts. In addition, each machine is provided the software instructions to execute each job and the wrapper program. Flow controller 310 uses the client systems to execute each job while ensuring asynchronous notification of status of execution of the job, as described below in further detail.

Flow controller 310 may send a wrapped job to job manager 320 in the following format:

wrapper-program job-specification port-number other-parameters wherein 'wrapper-program' specifies the specific file/command which needs to be executed by a client machine using the remaining arguments as parameters. The first argument 'job-specification' identifies the specific job which needs to be executed, port-number indicates a specific port (TCP/IP) on which flow controller 310 would listen for the status messages, and 'other-parameters' may be used to provide any additional data required for executing the job and/or to control the reporting of status information.

Job manager 320 may treat the wrapped job as any other job, and assign the wrapped job to one of the client machines in a known way. The manner in which implementation of client machines may support various features of the present invention is described below in further detail.

In an embodiment, the software instructions for 'wrapped-program' are encoded in Perl language, as noted above. The software instructions may fork a (operating system) 'process' (or task) to execute a program named by the first argument. Thus, the job identified by 'job-specification' is executed in a process. The wrapped program may open a communication channel using socket interface (commonly available in systems supporting TCP/IP), and send status message(s) asynchronously. For example, the processing time used by the forked process may be reported periodically.

In addition, once the execution of the job is complete and the forked process terminates, the wrapped program sends an asynchronous message indicating completion of execution of the job. The implementation of client machines will be apparent to one skilled in the relevant arts by reading the disclosure provided herein.

Flow controller 310 generally needs to 'listen' for message on the port number(s) specified in the above-noted command for the status messages. The information contained in the status messages may be used to schedule additional jobs as described above. The 'listening' task can also be implemented in a known way using socket interface.

Thus, several aspects of the present invention may be implemented in an example environment of FIG. 3. The description is continued with respect to embodiments of flow controller 310 and client machines 350-A through 350-Z implemented substantially in the form of software.

6. Software Implementation

Figure 4:
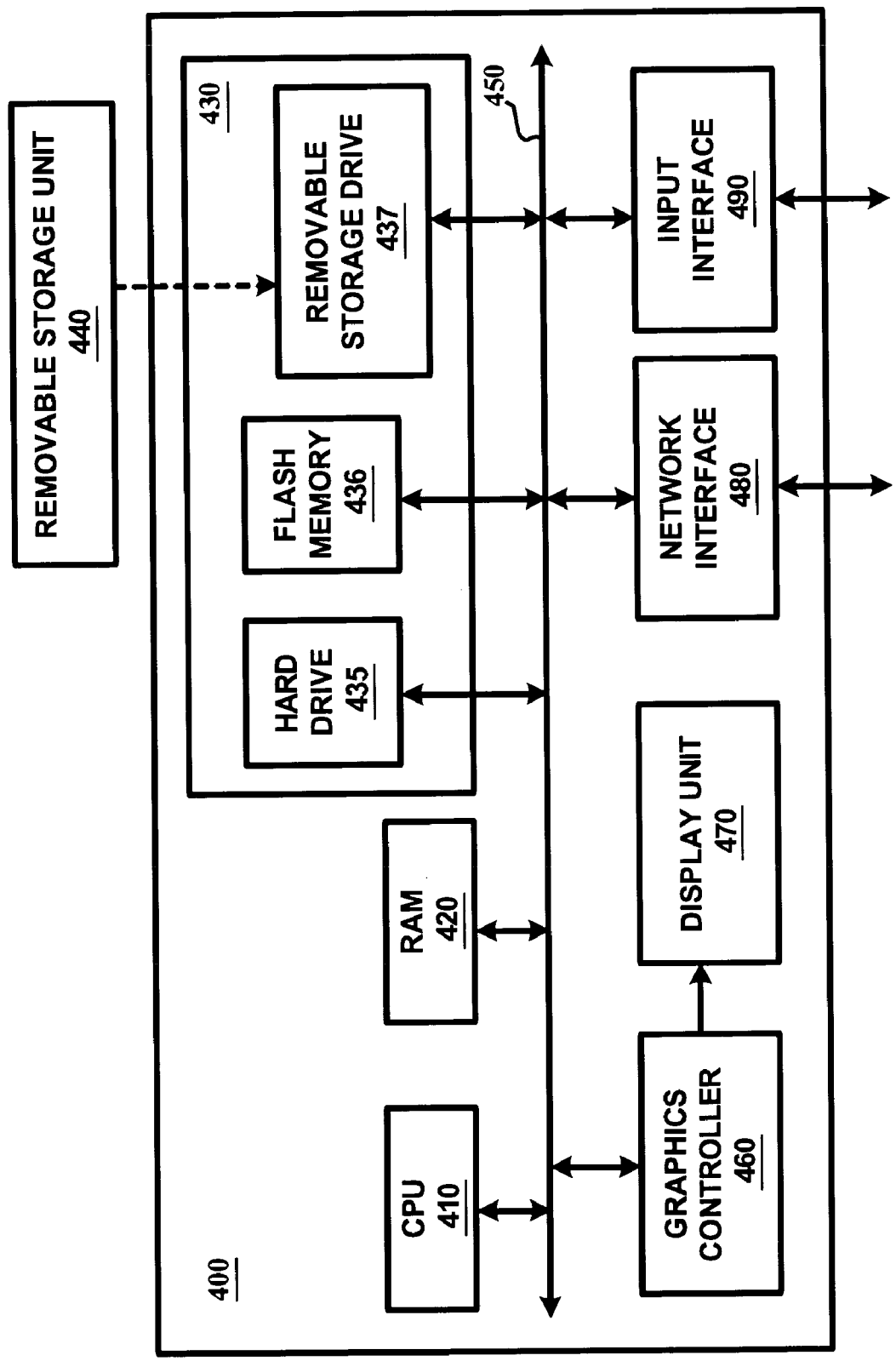
FIG. 4 is a block diagram illustrating an embodiment of a flow controller block implemented substantially in the form of software instructions according to an aspect of present invention.

FIG. 4 is a block diagram illustrating the details of digital processing system 400 implemented substantially in the form of software in an embodiment of the present invention. System 400 may correspond to one of flow controller 310 and client machines 350-A through 350-Z. System 400 may contain one or more processors such as central processing unit (CPU) 410, random access memory (RAM) 420, secondary memory 430, graphics controller 460, display unit 470, network interface 480, and input interface 490. All the components except display unit 470 may communicate with each other over communication path 450, which may contain several buses as is well known in the relevant arts. The components of FIG. 4 are described below in further detail.

CPU 410 may execute instructions stored in RAM 420 to provide several features of the present invention. CPU 410 may contain multiple processing units, with each processing unit potentially being designed for a specific task. Alternatively, CPU 410 may contain only a single processing unit. RAM 420 may receive instructions from secondary memory 430 using communication path 450. In the case of client machines, the instructions cause status messages to be sent, for example, using socket interface. In the case of flow controller, the messages are received on the specified port(s), and the messages are processed.

Graphics controller 460 generates display signals (e.g., in RGB format) to display unit 570 based on data/instructions received from CPU 410. Display unit 470 contains a display screen to display the images defined by the display signals. Input inter0face 490 may correspond to a key-board and/or mouse, and generally enables a user to provide inputs. Network interface 480 enables some of the inputs (and outputs) to be provided on a network. In general, display unit 470, input interface 490 and network interface 480 enable a user to check the status various characterization tasks, and may be implemented in a known way.

Secondary memory 430 may contain hard drive 435, flash memory 436 and removable storage drive 437. Secondary memory 430 may store the data and software instructions (e.g., to partition a characterization task into multiple jobs), which enable system 400 to provide several features in accordance with the present invention. Some or all of the data and instructions may be provided on removable storage unit 440, and the data and instructions may be read and provided by removable storage drive 437 to CPU 410. Floppy drive, magnetic tape drive, CD-ROM drive, DVD Drive, Flash memory, removable memory chip (PCMCIA Card, EPROM) are examples of such removable storage drive 437.

Removable storage unit 440 may be implemented using medium and storage format compatible with removable storage drive 437 such that removable storage drive 437 can read the data and instructions. Thus, removable storage unit 440 includes a computer readable storage medium having stored therein computer software and/or data.

In this document, the term "computer program product" is used to generally refer to removable storage unit 440 or hard disk installed in hard drive 435. These computer program products are means for providing software to system 400. CPU 410 may retrieve the software instructions, and execute the instructions to provide various features of the present invention as described above.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of characterizing a cell used in the design of an integrated circuit, said method comprising:
    partitioning a characterization task into a plurality of jobs with associated data/signal dependencies, wherein said characterization task characterizes said cell;
    scheduling one of said plurality of jobs for execution on a client machine;
    executing said one of said plurality of jobs on said client machine;
    sending an asynchronous message indicating a status of said job from said client machine;
    specifying said one of said plurality of jobs in a wrapper program; and
    executing said wrapper program on said client machine, wherein said wrapper program in turn causes execution of said one of said plurality of jobs, said wrapper program causing said asynchronous message to be sent.

2. The method of claim 1, further comprising scheduling another one of said plurality of jobs for execution after receiving said asynchronous message.

3. The method of claim 2, wherein said another one of said plurality of jobs is dependent on said one of said plurality of jobs.

4. The method of claim 2, wherein said another one of said plurality of jobs is also executed on said client machine.

5. The method of claim 1, wherein said partitioning groups said plurality jobs into leaf jobs, dependent jobs and a root job based on said associated dependencies.

6. The method of claim 1, wherein said asynchronous message indicates completion of execution of said one of said plurality of jobs.

7. The method of claim 1, wherein said sending uses a TCP/IP socket to send said asynchronous message.

8. A machine readable medium carrying one or more sequences of instructions for causing a system to characterize a cell used in the design of an integrated circuit, wherein execution of said one or more sequences of instructions by one or more processors contained in said system causes said one or more processors to perform the actions of:
    partitioning a characterization task into a plurality of jobs with associated data/signal dependencies, wherein said characterization task characterizes said cell;
    scheduling one of said plurality of jobs for execution on a client machine;
    executing said one of said plurality of jobs on said client machine;
    sending an asynchronous message indicating a status of said job from said client machine;
    specifying said one of said plurality of jobs in a wrapper program; and
    executing said wrapper program on said client machine, wherein said wrapper program in turn causes execution of said one of said plurality of jobs, said wrapper program causing said asynchronous message to be sent.

9. The machine readable medium of claim 8, further comprising scheduling another one of said plurality of jobs for execution after receiving said asynchronous message.

10. The machine readable medium of claim 9, wherein said another one of said plurality of jobs is dependent on said one of said plurality of jobs.

11. The machine readable medium of claim 9, wherein said another one of said plurality of jobs is also executed on said client machine.

12. The machine readable medium of claim 8, wherein said partitioning groups said plurality jobs into leaf jobs, dependent jobs and a root job based on said associated dependencies.

13. The machine readable medium of claim 8, wherein said asynchronous message indicates completion of execution of said one of said plurality of jobs.

14. The machine readable medium of claim 8, wherein said sending uses a TCP/IP socket to send said asynchronous message.

15. An apparatus for characterizing a cell used in the design of an integrated circuit, said apparatus comprising:
    means for partitioning a characterization task into a plurality of jobs with associated data/signal dependencies, wherein said characterization task characterizes said cell;
    means for scheduling one of said plurality of jobs for execution on a client machine;
    means for executing said one of said plurality of jobs on said client machine;
    means for sending an asynchronous message indicating a status of said job from said client machine;
    means for specifying said one of said plurality of jobs in a wrapper program; and
    means for executing said wrapper program on said client machine, wherein said wrapper program in turn causes execution of said one of said plurality of jobs, said wrapper program causing said asynchronous message to be sent.

16. The apparatus of claim 15, wherein said means for scheduling schedules another one of said plurality of jobs for execution after receiving said asynchronous message.

17. The apparatus of claim 15, wherein said asynchronous message indicates completion of execution of said one of said plurality of jobs.

18. The apparatus of claim 15, wherein said sending uses a TCP/IP socket to send said asynchronous message.

19. A characterization system for characterizing a cell used in a design of an integrated circuit, said characterization system comprising:
 a flow controller partitioning a characterization task into a plurality of jobs with associated data/signal dependencies, wherein said characterization task is designed to characterize said cell, said flow controller indicating that a first job is ready for execution, said first job being contained in said plurality of jobs;
 a plurality of client machines for executing said plurality of jobs;
 a job manager assigning said first job to a first client machine, said first client machine being contained in said plurality of client machines,
 wherein said first client machine sends an asynchronous message indicating a status of said job; and
 wherein said flow controller specifies said first job in a wrapper program, wherein said wrapper program is designed to execute said first job on said client machine, said wrapper program causing said asynchronous message to be sent.

20. The characterization system of claim 19, wherein said flow controller receives said asynchronous message and indicates another one of said plurality of jobs is ready for execution after receiving said asynchronous message, wherein said another one of said plurality of jobs is dependent on said one of said first job.

21. The characterization system of claim 19, wherein said asynchronous message indicates completion of execution of said first job.

22. The characterization system of claim 19, wherein said first client machine uses a TCP/IP socket to send said asynchronous message.

* * * * *